(12) United States Patent
Currie et al.

(10) Patent No.: US 9,629,251 B2
(45) Date of Patent: Apr. 18, 2017

(54) SUB-MICRON LASER PATTERNING OF GRAPHENE AND 2D MATERIALS

(71) Applicant: The United States of America, as represented by the Secretary of the Navy, Washington, DC (US)

(72) Inventors: Marc Currie, Gaithersburg, MD (US); David Kurt Gaskill, Alexandria, VA (US); Anindya Nath, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 238 days.

(21) Appl. No.: 14/565,734

(22) Filed: Dec. 10, 2014

(65) Prior Publication Data

US 2015/0163923 A1    Jun. 11, 2015

Related U.S. Application Data

(60) Provisional application No. 61/914,423, filed on Dec. 11, 2013.

(51) Int. Cl.
*C30B 29/04* (2006.01)
*H05K 3/02* (2006.01)
(Continued)

(52) U.S. Cl.
CPC .......... *H05K 3/027* (2013.01); *B23K 26/364* (2015.10); *B23K 26/402* (2013.01); *B23K 2203/30* (2015.10); *H05K 2201/0145* (2013.01); *H05K 2201/0323* (2013.01); *H05K 2203/016* (2013.01); *H05K 2203/107* (2013.01); *Y10T 29/49155* (2015.01)

(58) Field of Classification Search
CPC .................................. C30B 1/02; C30B 29/04
See application file for complete search history.

(56) References Cited

U.S. PATENT DOCUMENTS

2011/0092054 A1    4/2011  Seo et al.
2011/0318257 A1   12/2011  Sokolov et al.
(Continued)

FOREIGN PATENT DOCUMENTS

JP       2010120819 A     6/2010

OTHER PUBLICATIONS

Search Report and Written Opinion in corresponding application PCT/2014/069474.
(Continued)

*Primary Examiner* — Robert M Kunemund
(74) *Attorney, Agent, or Firm* — US Naval Research Laboratory; Joslyn Barritt

(57) ABSTRACT

An appropriately configured pulsed laser is focused onto a graphene sheet and is used to form a desired pattern in the graphene. When the laser pulse strikes the graphene, it modifies the bonding state of the carbon atoms in the graphene lattice, acting as a "blade" and causing a separation in the graphene sheet at the site of the laser pulse without causing damage to the surrounding graphene. The width of the separation, or "cut" in the graphene sheet can be controlled by controlling characteristics of the laser pulse such as beam shape, beam intensity, pulse width, repetition rate, and wavelength to produce a graphene material having desired electrical, optical, thermal, and/or mechanical properties.

22 Claims, 7 Drawing Sheets

(51) Int. Cl.
B23K 26/364 (2014.01)
B23K 26/402 (2014.01)
B23K 103/00 (2006.01)

(56) References Cited

U.S. PATENT DOCUMENTS

| 2012/0003438 A1 | 1/2012 | Appleton et al. |
| 2012/0049200 A1 | 3/2012 | Abraham et al. |
| 2012/0078161 A1 | 3/2012 | Masterson |

OTHER PUBLICATIONS

R. Faccio, L. Fernández-Werner, H. Pardo, C. Goyenola, P.A. Denis, and Á.W. Mombrú, "Mechanical and Electronic Properties of Graphene Nanostructures," Physics and Applications of Graphene—Theory, Dr. Sergey Mikhailov (Ed.), ISBN: 978-953-307-152-7 (2011).

F. Bonaccorso, Z. Sun, T. Hasan and A.C. Ferrari, "Graphene photonics and optoelectronics," Nature Photonics, vol. 4, Sep. 2010, pp. 611-622.

G.H. Han, S. Chae, E.S. Kim, S.F. Gane, I. Lee, S.W. Lee, S.Y. Lee, S.C. Lim, H.K. Jeong, and M.S. Jeong, "Laser thinning for monolayer graphene formation: heat sink and interference effect," ACS Nano 2011, 5, 263-268.

Y. Zhou and K.P. Loh, "Making patterns on graphene." Advanced Materials 2010, 22, 3615-3620.

Y. Zhou, Q. Bao, B. Varghese, L.A.L. Tang, C.K. Tan, C. Sow, and K.P. Loh, "Microstructuring of graphene oxide nanosheets using direct laser writing," Advanced Materials 2010, 22, 67-71.

Y. Wang, X. Xu, J. Lu, M. Lin, Q. Bao, B. Ozyilmaz, and K.P. Loh, "Toward high throughput interconvertible graphane-to-graphene growth and patterning," ACS Nano 2010, 4, 6146-6152.

D.A. Sokolov, K.R. Shepperd, T.M. Orlando, "Formation of graphene features from direct laser-induced reduction of graphite oxide," Journal of Physical Chemistry Letters 2010, 1, 2633-2636.

Y. Zhang, L. Guo, S. Wei, Y. He, H. Xia, Q. Chen, H. Sun, and F. Xiao, "Direct imprinting of microcircuits on graphene oxides film by femtosecond laser reduction," Nano Today 2010, 5, 15-20.

SUB-MICRON LASER PATTERNING OF GRAPHENE AND 2D MATERIALS

CROSS-REFERENCE

This application is a Nonprovisional of, and claims the benefit of priority under 35 U.S.C. §119 based on, U.S. Provisional Patent Application No. 61/914,423 filed on Dec. 11, 2013, the entirety of which is hereby incorporated by reference into the present application.

TECHNICAL FIELD

The present invention relates to graphene films, and in particular to the patterning of graphene films for their use in graphene devices and circuits.

BACKGROUND

Graphene is a monolayer of conjugated $sp^2$ bonded carbon atoms tightly packed into a two-dimensional (2D) hexagonal lattice. It has been the subject of much research in recent years due to its unique electrical, optical, and physical properties. One of those properties is its high electron mobility, which has made it very desirable as the foundation of electronic devices such as transistors, capacitors, and sensors. The two-dimensional nature of graphene also makes it highly attractive for optoelectronic applications, while its tightly packed hexagonal structure makes it attractive for micro-mechanical device applications. See, e.g., R. Faccio, L. Fernández-Werner, H. Pardo, C. Goyenola, P. A. Denis, and Á. W. Mombrú, "Mechanical and Electronic Properties of Graphene Nanostructures," *Physics and Applications of Graphene—Theory*, Dr. Sergey Mikhailov (Ed.), ISBN: 978-953-307-152-7 (2011); and F. Bonaccorso, Z. Sun, T. Hasan and A. C. Ferrari, "Graphene photonics and optoelectronics," *Nature Photonics*, Vol. 4, September 2010, pp. 611-622.

Creating such electronic devices requires patterning of the raw materials making up the device. For electronics and similar applications, the industry standard is to use an optical and chemical-based lithographic technique for pattering.

A variety of methods have been developed to pattern graphene.

Most conventional patterning of graphene involves the use of wet or dry chemicals applied to the surface as lithography resists to form a mask for patterning by etching.

However, unlike conventional three-dimensional (3D) materials which retain their bulk 3D properties when they are patterned to form electronic devices on their surface, graphene is in the form of a continuous two-dimensional surface having no three-dimensional properties, such that anything which interacts or attaches to its surface modifies its properties. Although this property of graphene makes it a good sensor, it makes it hard to chemically pattern graphene into devices, since the chemicals conventionally used for patterning can influence the properties of the graphene and so may not be suitable for patterning such a material.

For example, unlike with conventional 3D materials, residue from the resist cannot be cleaned from the graphene surface after patterning by $O_2$ plasma ashing due to low selectivity between graphene and carbon-based polymers. The presence of such residue is a p-type compensator of the graphene and also increases carrier scattering, significantly reducing the graphene's potential when it is patterned into circuits and devices. Such resist residues also inhibit conformal metal deposition that leads to high and inconsistent graphene-metal contact resistance.

Other methods have attempted to pattern graphene by using a laser. Many of these methods, however, start with a material that is not graphene and transform it into patterned graphene using a laser, a thermal anneal, or other process, and the quality of the patterned graphene produced by these methods is usually much poorer than that of unpatterned large-area graphene.

For example, Han et al. use a laser to achieve a monolayer of graphene from multilayer graphene by heating to "thin" the graphene sheets. See G. H. Han, S. Chae, E. S. Kim, S. F. Güne, I. Lee, S. W. Lee, S. Y. Lee, S. C. Lim, H. K. Jeong, and M. S. Jeong, "Laser thinning for monolayer graphene formation: heat sink and interference effect," *ACS Nano* 2011, 5, 263-268.

Zhou and Loh use a laser to locally modify graphene oxide (GO) and then use hydrazine gas or high-temperature annealing to create the graphene. See Y. Zhou and K. P. Loh, "Making patterns on graphene." *Advanced Materials* 2010, 22, 3615-3620.

Zhou et al. use a focused laser beam to construct an extended area of micropatterned GO and reduced GO multilayers on quartz substrates. See Y. Zhou, Q. Bao, B. Varghese, L. A. L. Tang, C. K. Tan, C. Sow, and K. P. Loh, "Microstructuring of graphene oxide nanosheets using direct laser writing," *Advanced Materials* 2010, 22, 67-71.

Wang et al. mention (but do not demonstrate) a means of converting graphane to graphene by a laser microstructuring system in a single chamber for simultaneous "grow-and-pattern" process. See Y. Wang, X. Xu, J. Lu, M. Lin, Q. Bao, B. Özyilmaz, and K. P. Loh, "Toward high throughput interconvertible graphane-to-graphene growth and patterning," *ACS Nano* 2010, 4, 6146-6152.

Sokolov et al. demonstrate direct laser-induced reduction of graphite oxide into patterned graphene films. See D. A. Sokolov, K. R. Shepperd, T. M. Orlando, "Formation of graphene features from direct laser-induced reduction of graphite oxide," *Journal of Physical Chemistry Letters* 2010, 1, 2633-2636; see also U.S. Patent Application Publication No. 2011/0318257 by D. A. Sokolov, K. R. Shepperd, T. M. Orlando, "Production of graphene sheets and features via laser processing of graphite oxide/graphene oxide," (2011).

Zhang et al. use a femtosecond laser to locally reduce graphene oxide into patterned graphene. See Y. Zhang, L. Guo, S. Wei, Y. He, H. Xia, Q. Chen, H. Sun, and F. Xiao, "Direct imprinting of microcircuits on graphene oxides film by femtosecond laser reduction," *Nano Today* 2010, 5, 15-20.

In all of these methods, either the graphene is damaged by the process or large areas of graphene or some other starting material must be produced and then processed to produce the desired patterns and properties. This increases the expense and complexity of graphene devices and reduces their yield. Thus, there is a need for a method for producing a localized pattern on graphene that does not introduce compensating impurities or scattering sites.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a method for chemical-free, direct, sub-micron laser patterning of graphene thin films.

In accordance with the present invention, an appropriately configured pulsed laser is focused onto a graphene sheet and directed along its surface to form a desired pattern in the graphene. When the laser pulse strikes the graphene, it modifies the bonding state of the carbon atoms in the graphene lattice and ablates carbon atoms from the graphene lattice on a sub-micron scale to form a separation or "channel" in the graphene sheet at the site of the laser pulse without causing damage to the surrounding graphene. The laser thus acts as a controllable "blade" through the graphene, with the extent of the ablation and the characteristics of the channel cut into the graphene sheet being tunable by varying characteristics of the laser pulse such as beam shape, beam intensity, pulse width, repetition rate, and wavelength.

In an exemplary embodiment, a channel in a graphene sheet having an 800 nm width can be produced using a laser beam of 50 femtosecond (fs) optical pulses having an 800-nm center wavelength, a 35-nm optical bandwidth (full width at half maximum), and an average optical irradiance of ~80 kW cm$^{-2}$ corresponding to a pulse energy of about 3 nJ and an optical pulse fluence of about 0.3 J cm$^{-2}$. This average optical irradiance is more than 4× less than for damage (not ablation) induced in graphene-oxide by continuous wave (cw) lasers, and thus permits locally patterning the graphene while leaving the adjacent graphene in pristine condition. See Y. Zhou, Q. Bao, B. Varghese, L. A. L. Tang, C. K. Tan, C. Sow, and K. P. Loh, "Microstructuring of Graphene Oxide Nanosheets Using Direct Laser Writing," *Adv. Mater.* 22, 67 (2010).

The method of the present invention can produce sub-micron scale ablated channels and/or modified areas in the graphene, with the width of the ablated or modified area being tunable by controlling the wavelength and intensity of the beam.

Patterning the graphene in accordance with the present invention can also alter the optical and mechanical properties of the graphene by providing areas of the graphene having a greater or lesser density of carbon atoms therein. Thus, by forming a desired pattern of channels of various widths and shapes in the graphene, the graphene can be modified to exhibit desired electrical, optical, and/or mechanical properties.

The method of the present invention can allow direct patterning of large areas of graphene, providing sub-micron features with high electrical isolation with minimal impact to the quality of the remainder of the graphene sheet.

DETAILED DESCRIPTION

Figure 1:
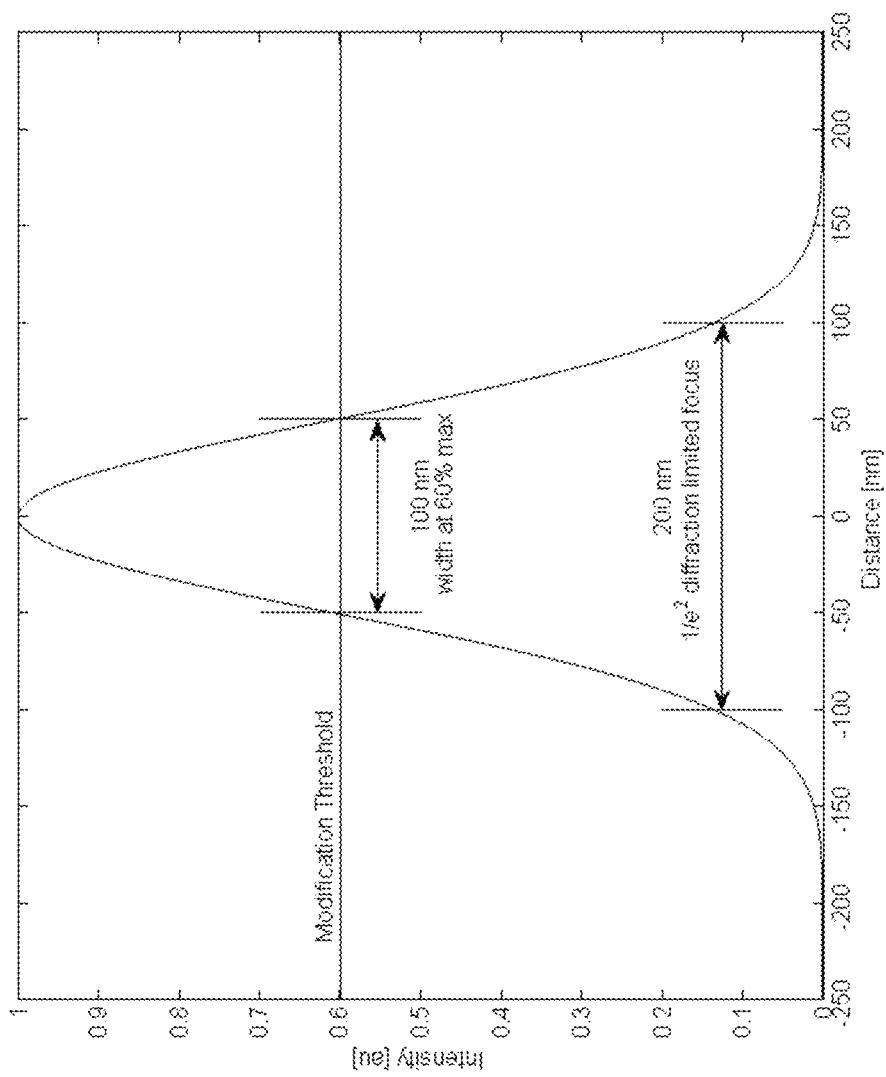
FIG. 1 is a plot illustrating a spatial profile of an exemplary laser beam used to pattern a graphene sheet in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a method for patterning graphene on a substrate.

In accordance with the present invention, an appropriately configured pulsed laser is focused onto a graphene sheet and moved along its surface to form a desired pattern in the graphene. When the laser pulse strikes the graphene, it modifies the bonding state of the carbon atoms in the graphene lattice and ablates them from the graphene on a sub-micron scale to cause the formation of a separation in the graphene sheet at the site of the laser pulse without causing damage to the surrounding graphene. The laser thus acts as a controllable "blade" through the graphene, with the width of the separation or "channel" cut into the graphene sheet being controlled by varying characteristics of the laser pulse such as beam shape, beam intensity, pulse width, repetition rate, and wavelength.

Graphene's physical properties include one of the highest electrical and thermal conductivities known, while also having one of the largest known optical absorption coefficients (2.3% per single layer, 0.33 A-thick) and the highest Young's modulus and tensile strength. Consequently, lasers have not previously been used to ablate graphene, as the high in-plane thermal conductivity of graphene can remove the heat from a laser pulse as quickly as it is deposited. This is analogous to trying to solder/weld a metal pipe with water in it, since getting the metal pipe hot is hard enough, but the thermal capacity of the moving water keeps removing large amounts of heat. In addition, high-quality graphene is often epitaxially grown (and/or deposited) on substrates with high thermal conductivities, which facilitates even greater heat removal from the graphene sheet.

Marc Currie, one of the inventors of the present invention previously demonstrated that when a laser beam strikes the surface of a graphene sheet that was created by chemical vapor deposition on copper and then transferred onto a quartz substrate, energy from the laser is transferred to the carbon atoms in the graphene lattice and modifies the bonding state between the carbon, effectively creating locally modified areas in the graphene that behave like bulk carbon instead of graphene. See M. Currie, J. D. Caldwell, F. J. Bezares, J. Robinson, T. Anderson, H. Chun, and M.

Tadjer, "Quantifying pulsed laser induced damage to graphene," *Appl. Phys. Lett.* 99, 211909 (2011), the entirety of which is hereby incorporated by reference into the present disclosure. However, it was not known at the time that illuminating a graphene sheet with a laser could be used to create localized modified areas in other types of graphene such as epitaxial or CVD-grown graphene or that it could produce localized modified areas on a sub-micron scale. Moreover, it was not known at the time of the 2011 paper how to use a laser to controllably ablate carbon atoms from any type of graphene to produce a desired pattern or achieve device isolation as in the present invention.

Using laser pulses with a time scale much shorter than the material's thermal time constant helps create a highly non-equilibrium heating of the material so that the portion of the material that is illuminated by the laser pulse absorbs the pulse energy and is heated while the surrounding area is not. However, since graphene also has one of the highest thermal conductivities one skilled in the art would not expect that even such non-equilibrium heating would be sufficient to modify graphene's $sp^2$ carbon bonds or to ablate the material.

The inventors of the present invention have discovered that when a laser is configured to produce a pulsed laser beam having the proper choice of pulse parameters, i.e., wavelength, beam shape, optical fluence, pulse width, focusing, repetition rate, and/or exposure time, illuminating a graphene sheet with such a properly configured pulsed beam can in fact provide sufficient non-equilibrium heating in the graphene to form a precisely defined pattern in the graphene without damaging the unilluminated and/or partially illuminated material. That is, if the optical illumination of the graphene produced by the photon energy, energy flux, and/or temporal duration of the laser beam is sufficient, the energy imparted by the laser pulses into the carbon bonds doesn't just change their bonding state but causes an ablation of the carbon atoms, forming a separation along a channel defined by the path of the laser beam along the graphene surface. These unbonded carbon atoms can either remain within the laser-defined channel or can be removed, e.g., by recoil force of the ablation process, depending upon the patterning conditions. The energy from the laser dissipates quickly within the graphene lattice, and is transferred only to those carbon atoms directly illuminated by the laser pulse and nearest-neighbor atoms, leaving the remainder of the graphene lattice undamaged.

Thus, in accordance with the present invention, a desired pattern comprising one or more channels cut into the graphene surface can be formed without damaging the surrounding material by illuminating the graphene sheet with a pulsed laser beam.

The width of the cut in the graphene depends on the laser parameters, the optical system used, and the spot size of the pulse incident on the graphene surface. A diffraction-limited focal spot can achieve a minimum diameter of about ½ of the wavelength of the laser light striking the graphene.

The ablation size can be smaller than the optical beam due to optical threshold effects and the spatial profile of the optical beam.

FIG. 1 is a plot of the spatial profile of an exemplary laser beam that can be used to produce sub-micron scale patterns in graphene in accordance with the present invention. The size of the modified or ablated area in the graphene can be smaller than the optical beam due to nonlinear optical threshold effects and can be controlled by the spatial profile of the optical beam. For example, a 400-nm laser can produce a diffraction-limited laser spot having a 200-nm diameter, measured as the width between the $1/e^2$ (13.5%) intensity points of a Gaussian beam as illustrated by the plot shown in FIG. 1. However, if the threshold for damage/ablation of the material is set to 60% of the peak value, this leads to a modified diameter smaller than the $1/e^2$ width, which, as shown in FIG. 1, is determined by the intensity above the threshold at 60% of the maximum intensity. This 100-nm width for intensities greater than 60% of the peak intensity is half of the diffraction-limited focal spot. This demonstrates that by adjusting the wavelength and intensity of the laser beam illuminating the graphene, ablated and/or modified areas having a size/width of even less than 100 nm can be produced.

In addition, modifying the laser pulse's parameters (spectral, temporal, etc.) as well as the spatio-temporal and spatio-spectral pulse characteristics can influence the laser modified and/or ablated graphene region. By changing one or more parameters of the laser pulse, the extent to which the carbon atoms are ablated from the graphene can be tuned to produce a patterns in the graphene sheet comprising one or more of fully ablated channels, partially ablated channels, or modified but not ablated areas. Such patterning in accordance with the present invention can alter the electrical, optical, and/or mechanical properties of the graphene, and thus such properties can be tunably altered by changing the configurations of the laser pulses illuminating the graphene.

In an exemplary embodiment, a channel in a graphene sheet having an 800 nm width can be produced using a laser beam of 50 femtosecond (fs) optical pulses having an 800-nm center wavelength, a 35-nm optical bandwidth (full width at half maximum), and an average optical irradiance of ~80 kW cm$^{-2}$ corresponding to a pulse energy of about 3 nJ and an optical pulse fluence of about 0.3 J cm$^{-2}$. This average optical irradiance is more than 4× less than for damage (not ablation) induced in graphene by continuous wave (cw) lasers, and thus permits locally patterning the graphene while leaving the adjacent graphene in pristine condition.

A laser used in the method of the present invention can be a continuous wave (cw) or pulsed laser. However, in most cases pulsed lasers are preferred. If a cw laser is used, the high heat capacity and thermal conductivity of graphene influence the ablation process and create a damaged area much larger than the laser spot size. In contrast, pulsed lasers have the potential for nonlinear absorption and nonequilibrium heating such that their sub-picosecond energy absorption times are much faster than thermal or acoustic processes, thereby enabling patterning in the graphene with smaller damage areas and sharper boundaries. Thus, patterning in accordance with the present invention can be accomplished using femtosecond-scale laser pulses with an average optical irradiation less than 4× lower than the irradiation needed to damage the graphene with a continuous (cw) laser, in which the damage is usually due to local heating.

This method in accordance with the present invention enables sub-micrometer patterning of graphene circuits, devices, and sensors without the need for chemical-based lithographic fabrication, providing more controllable fabrication of higher quality devices. In addition, this patterning can be performed during graphene growth and/or transfer enabling three dimensional devices from layers of patterned graphene. This technique can be extended to other 2D materials as well as to heterostructures created from stacking of patterned layers of these 2D materials.

In some embodiments of laser patterning of graphene in accordance with the present invention, a pattern can be formed on epitaxial or CVD graphene formed on SiC; however, one skilled in the art will readily recognize that the method for laser-patterning graphene in accordance with the present invention can be used for many other types of graphene as well, such as graphene transferred or synthesized on substrates other than SiC, graphene exfoliated from graphite, or chemically synthesized graphene (e.g., graphene produced by reduction of graphene oxide as well as other forms of graphene produced via some chemical process), and laser-patterning of any suitable type of graphene using the techniques described herein are deemed to be within the scope of the present invention.

Figure 2B:
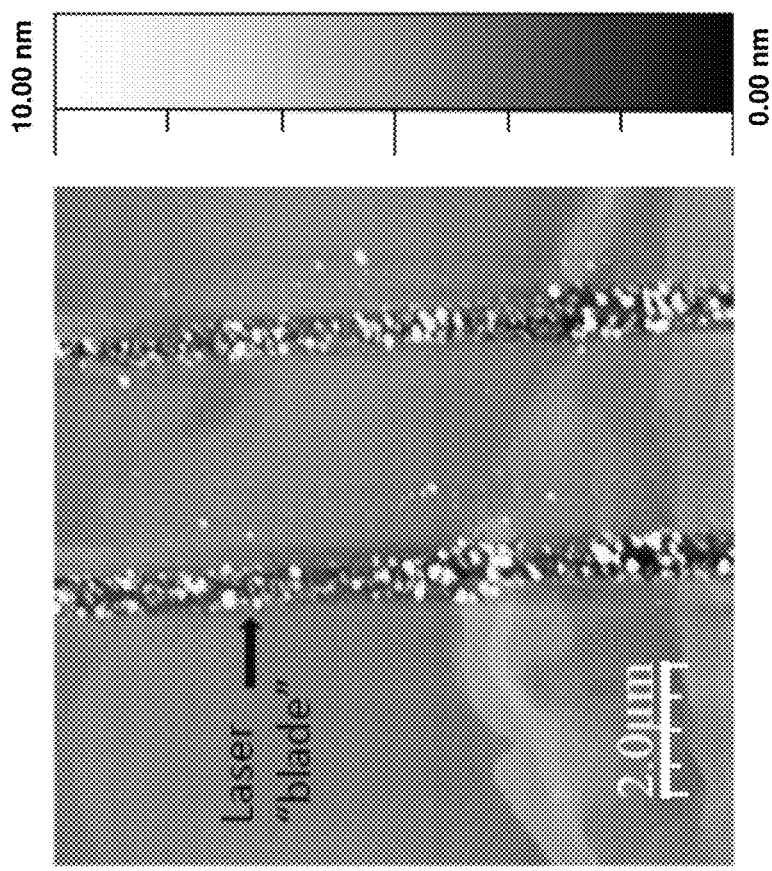
FIGS. 2A and 2B are atomic force microscopy (AFM) images depicting the surface of a graphene sample before (FIG. 1A) and after (FIG. 1B) patterning of the graphene with a laser in accordance with the present invention.
Figure 2A:
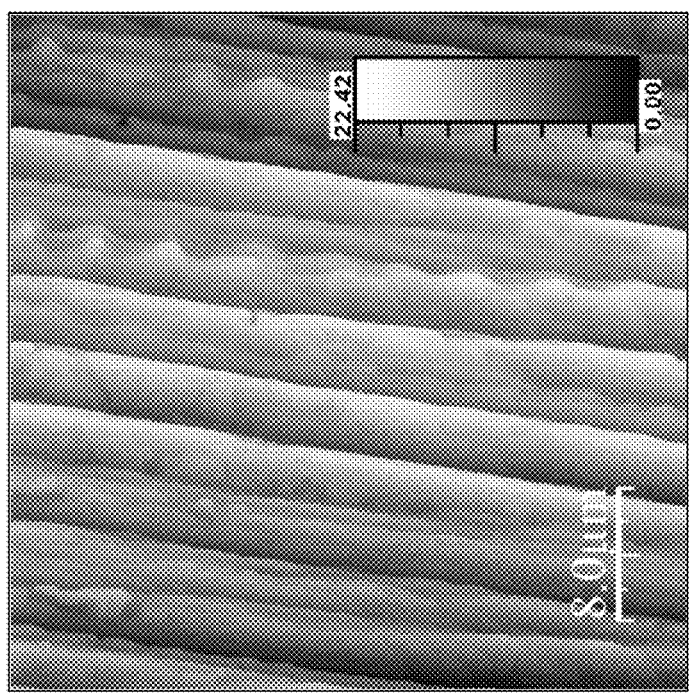

FIGS. 2A and 2B illustrate aspects of the way in which a cut can be formed in graphene sample using by an appropriately configured laser focused on the sample in accordance with the present invention.

FIG. 2A is an atomic force microscopy (AFM) image showing the surface of a pristine graphene sample before the sample is illuminated by a pulsed laser beam focused thereon. As can be seen from the image shown in FIG. 2A, the graphene is continuous over the terrace and step structure of the underlying SiC surface.

FIG. 2B shows a similar graphene sample after it has been patterned by laser illumination in accordance with the present invention. In the image shown in FIG. 2B, the two laser-patterned lines (vertical) can be clearly discerned and the surrounding morphology of the graphene on SiC was not affected by the patterning. The white spots are due to debris due to residual balled up $sp^3$ carbon which is now not connected to other debris or the edges of the graphene. As can be seen from the image in FIG. 2B, the laser continuously patterns the graphene, even when the pattern extends over a substrate step in the surface.

Thus, as shown in FIG. 2B, in accordance with the present invention, a pulsed laser configured to provide sufficient energy to the graphene surface acts as a "blade" passing through the graphene, forming a narrow, precisely defined cut in the graphene lattice. In the exemplary case shown in FIG. 2B, a channel having a width <1 μm was cut into the graphene using laser pulses in the visible wavelength range. Although a small amount of debris from the laser patterning remains in the isolation channel, as described in more detail below, measurements taken by the inventors show that such debris does not substantially affect the electrical isolation of electronic devices on the thus-patterned graphene sheet.

Figures 3A, 3B:
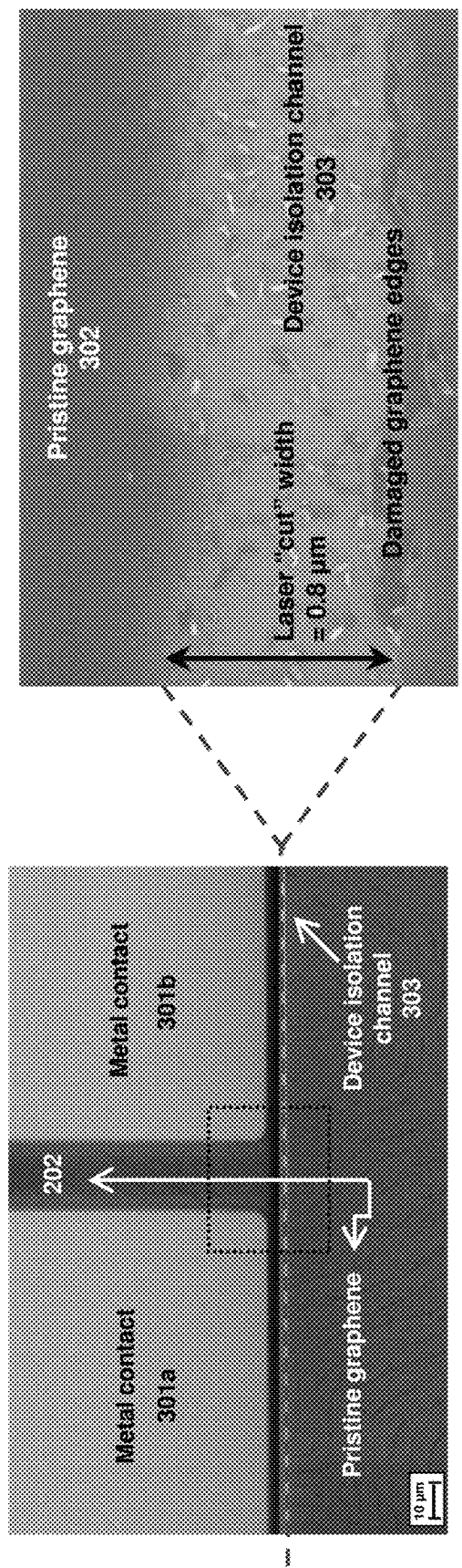
FIGS. 3A and 3B are scanning electron microscopy (SEM) images depicting additional aspects of a graphene sample patterned with a laser in accordance with the present invention.

FIGS. 3A and 3B further illustrate aspects of laser patterning of graphene in accordance with the present invention to perform device isolation FIG. 3A depicts a portion of a graphene sample on which has been deposited metal contacts, with the remaining surface area of the graphene surface comprising pristine graphene 202. To perform isolation of the electronic device comprising the metal contacts, the graphene is patterned to form isolation channel 303 using femtosecond-scale laser pulses in accordance with the method of the present invention. The formation of isolation channel 303 isolates the current in the device such that current only flows in the graphene between the metal contacts 301a/301b, while device isolation channel 303 prohibits current flow in the graphene outside the channel. As illustrated by the plots shown in FIGS. 6A and 6B, discussed in more detail below, the channels provide an isolation in the device of about $10^{12}$ ohms. That is, at a sweep voltage of 2V, a device isolated on a graphene sheet in accordance with the present invention outputs a current of $4 \times 10^{-12}$ Amps, which according to Ohm's law, implies a resistance of $0.5 \times 10^{12}$ ohms.

FIG. 3B is an SEM image showing a more detailed view of device isolation channel 303 shown in FIG. 3A. As can be seen from the image shown in FIG. 3B, device isolation channel 303 formed by the laser "blade" patterning of the graphene has a width of 0.8 μm. Although the edges of the portion of the graphene sheet immediately adjacent to the channel show some damage, the damage is highly localized, with the rest of the graphene sheet, including the graphene immediately adjacent the metal contacts, remaining in an undamaged, pristine state. In addition, although a small amount of debris from the laser patterning remains in the isolation channel, the measurements taken by the inventors show that such debris does not substantially affect the device isolation for the ablation conditions employed.

Figure 4:
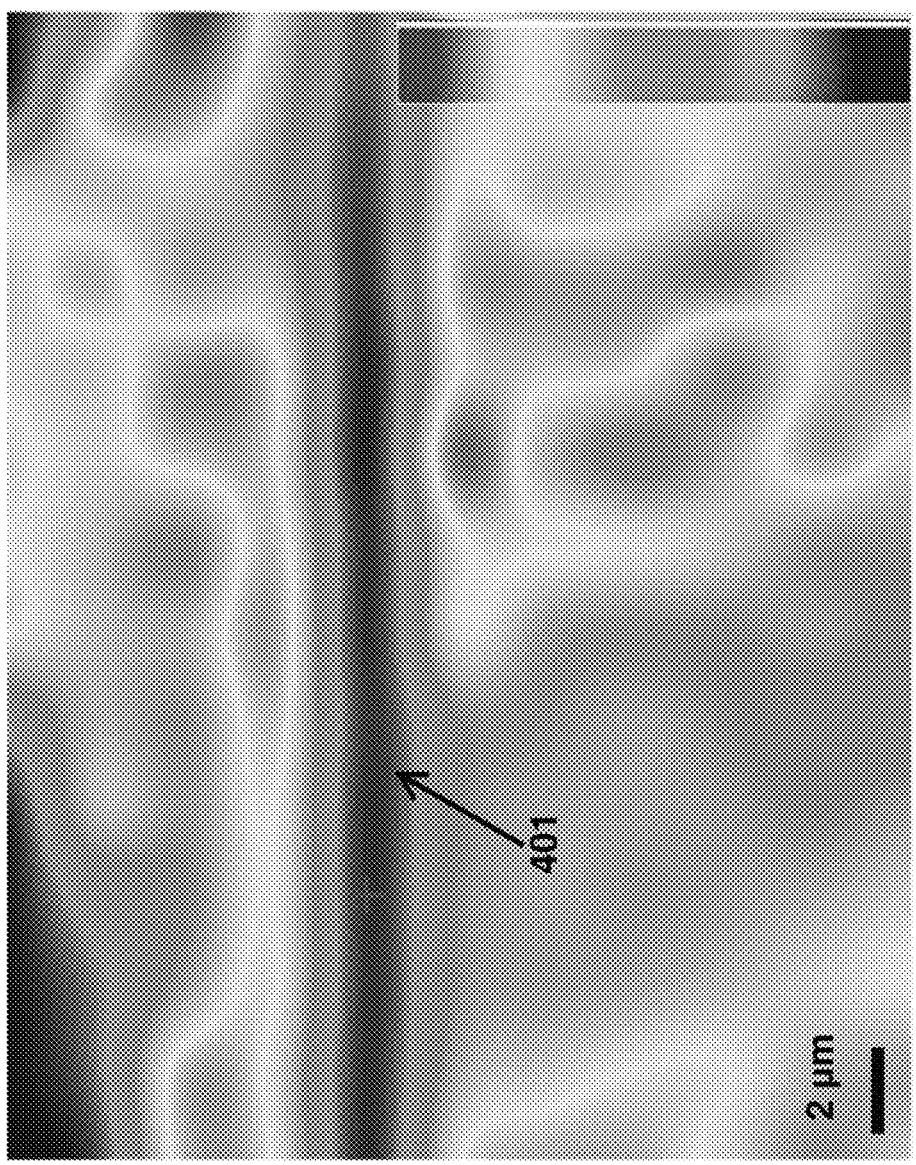
FIG. 4 is a Raman two-dimensional intensity map of the boxed area shown in FIG. 3A.

FIG. 4 is a Raman map of the graphene 2D peak intensity of the patterned graphene shown in FIG. 3B. Isolation channel 401 shown in FIG. 4 has the darkest shading, which is indicative of a lack of intensity for the 2D peak and is indicative of no graphene in that area, and thus confirms the complete removal of graphene from the areas damaged with the laser. In contrast, the Raman map of the areas on both sides of the isolation channel 401 show 2D peak intensity similar to the starting material, indicating the presence of graphene and hence, shows that the graphene next to the isolation line was not altered due to the use of a pulsed laser.

Figure 5:
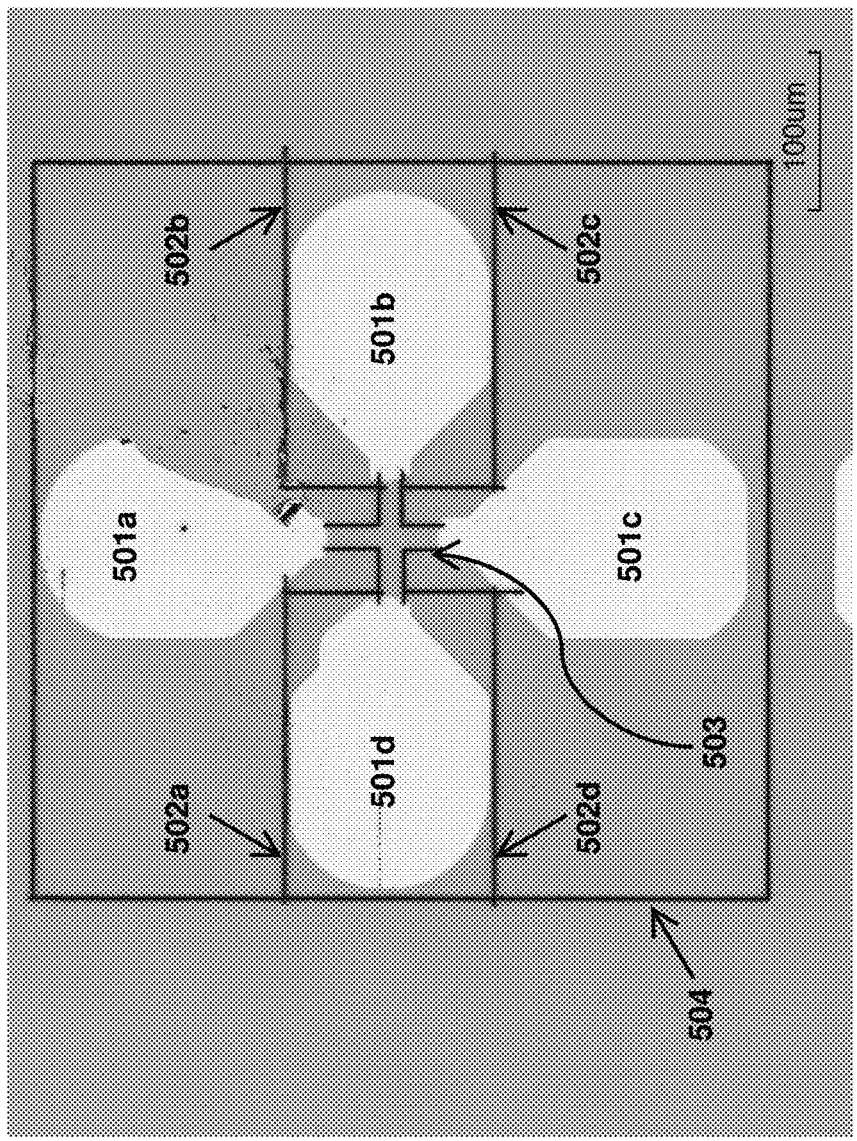
FIG. 5 is an optical microscope image depicting an exemplary embodiment of an electronic device formed on a graphene sample patterned with a laser in accordance with the present invention.

FIG. 5 further illustrates device isolation using laser patterning of a graphene sheet in accordance with the present invention. FIG. 5 is an optical image depicting a graphene sheet having an electrical device comprising metal contacts 501a, 501b, 501c, and 501d deposited thereon. Each contact region is isolated from the others by channels 502a, 502b, 502c, 502d, and 504 cut into the graphene in accordance with the present invention, and are connected to each other only through the graphene Hall cross region 503, which defines the only electrically conducting path in the device.

Since the metal was deposited on the graphene by a shadow mask, the pristine nature of the graphene is maintained, and the device was used to measure the electrical Hall properties, i.e., the intrinsic carrier concentration and sheet resistance, of the graphene in the Hall cross region 503. As a result, the effects of device isolation using laser patterning in accordance with the present invention can be compared with those provided by traditional chemical-based lithography, which can aid in the determination of the effects various patterning techniques have on the graphene. This demonstrates that a useful device can be fabricated using the laser patterning process in accordance with the present invention.

Figure 6B:
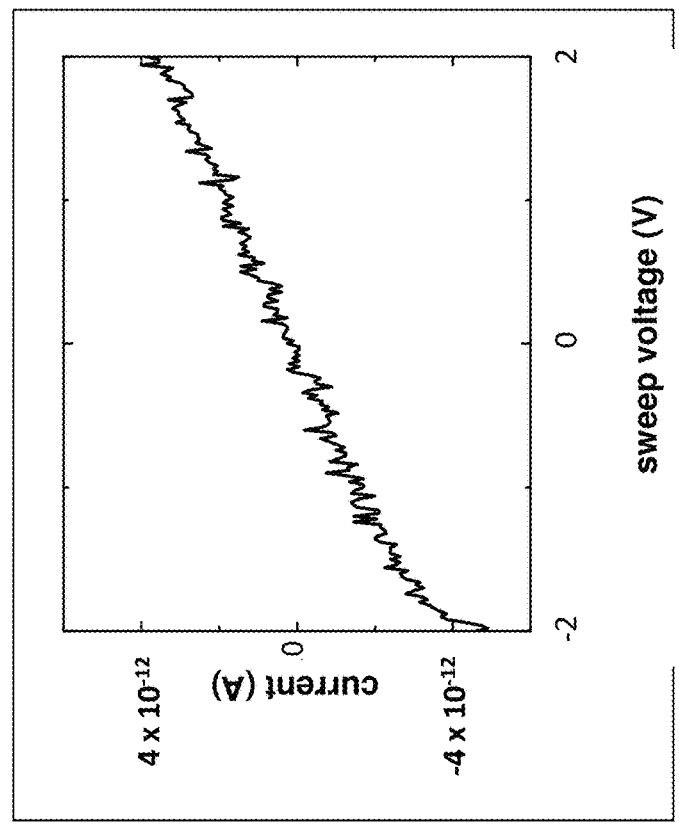
FIGS. 6A and 6B are plots illustrating the improvement in device isolation for a device on a graphene sheet that has been laser-patterned in accordance with the present invention.
Figure 6A:
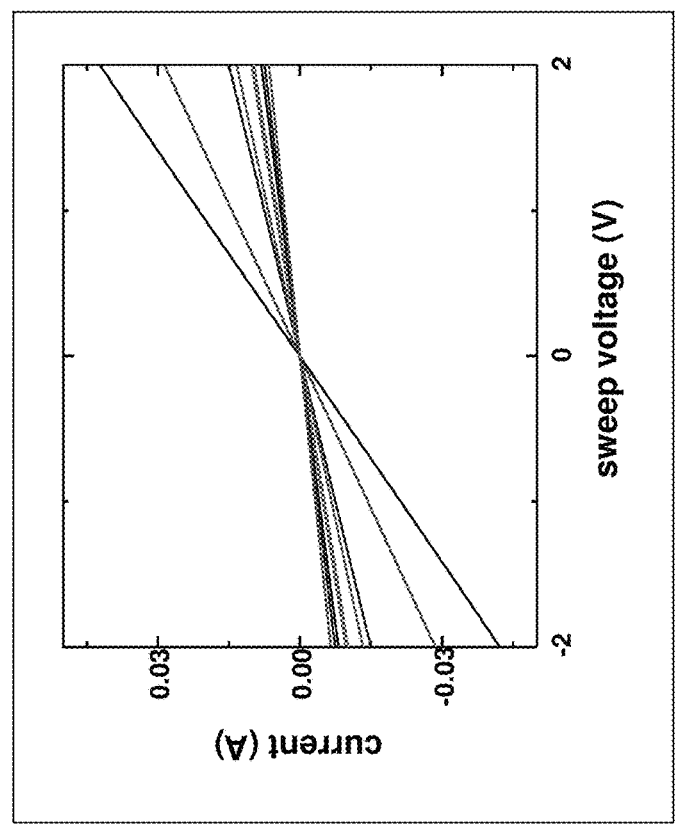

FIGS. 6A and 6B are plots illustrating the improvement in device isolation for a device on a graphene sheet that has been laser-patterned in accordance with the present invention.

The plots in FIGS. 6A and 6B both illustrate current flow between contacts in an electrical device formed on a graphene sheet. FIG. 6A is a plot of room-temperature curves for varying separation (5-60 μm) of an isolated transfer length measurement device showing Ohmic behavior; the patterned transfer length geometry was isolated from the surrounding graphene material by the laser patterned invention. FIG. 6B is a plot of a room temperature I-V curve between two transfer length measurement devices on a graphene sheet, where the devices are 15 μm apart and are separated by isolation channels cut into the graphene in accordance with the present invention. Identical measurement conditions were used for all measurement and the measurements were performed under vacuum ($10^{-4}$ T).

The data plots shown in FIG. 6A show that a current of about 10 mA flows unhindered between contact pads when a 2 V bias is applied. When the laser pattern is applied, the same applied bias results in a current reduction by over nine orders of magnitude to about a pA, as shown in FIG. 6B. This demonstrates that the appropriate laser patterning results in significant isolation.

In addition, as noted above, patterning affects not only its electrical properties of graphene but also its optical and mechanical properties as well. Thus, by forming one or more channels and/or modified areas in the graphene, the characteristics of which can be tuned by configuring the properties of the laser pulses illuminating the graphene as described above, in accordance with the present invention, a graphene sheet (or a graphene material comprising two or more of such sheets) having desired electrical, optical, thermal, and/or mechanical properties can be produced.

Figure 7:
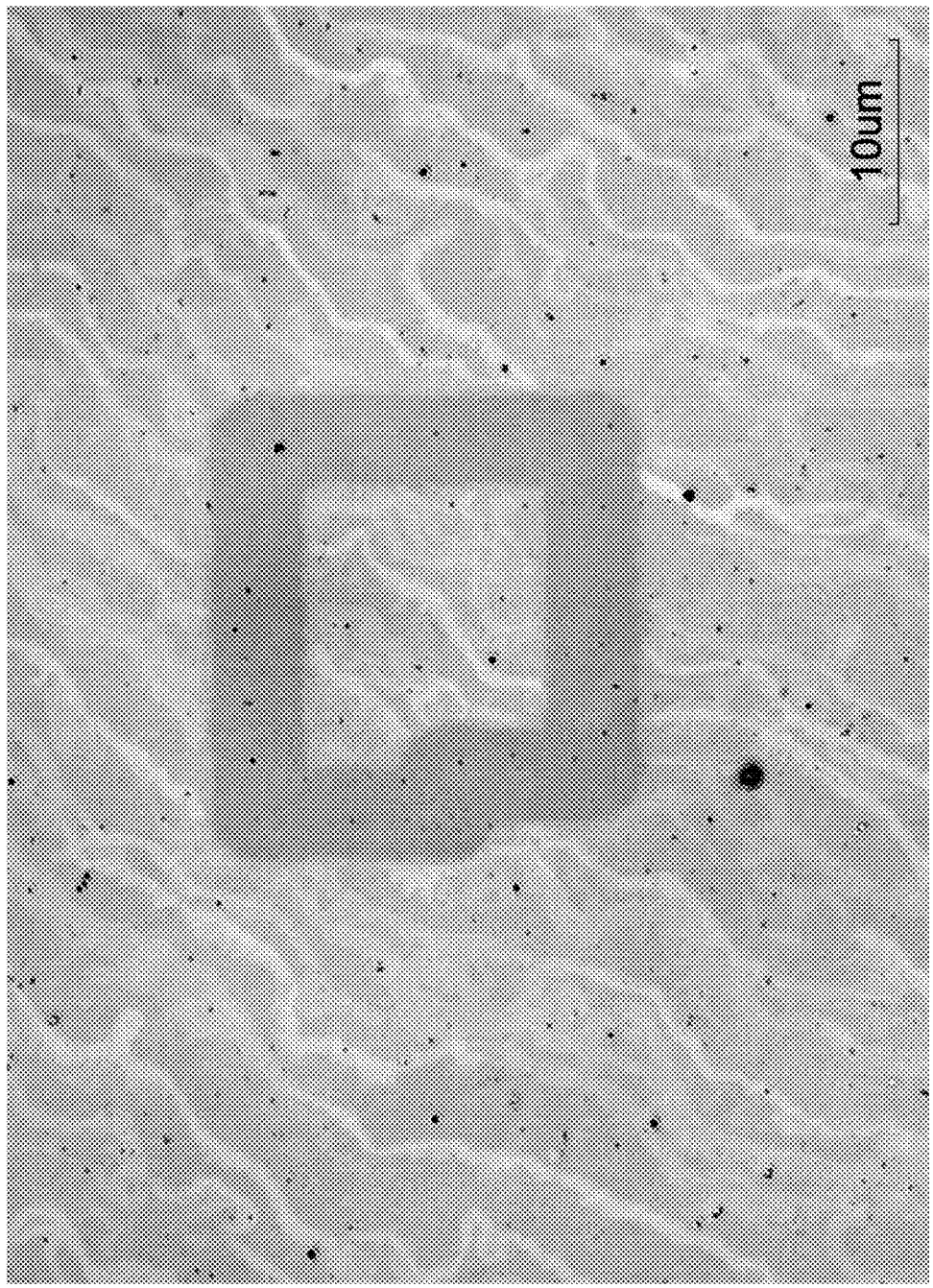
FIG. 7 is an optical image illustrating a change in the optical properties of a graphene sheet that has been laser-patterned in accordance with the present invention.

FIG. 7 is an optical image illustrating how the optical properties of a graphene sheet can be modified by laser-patterning in accordance with the present invention. FIG. 7 depicts a graphene sheet in which a laser was used to draw a box in the graphene, wherein the darkened region is where the graphene has been modified by the laser. This region can made darker or lighter than the surrounding graphene by tuning the laser properties as described above to control the extent of ablation of the carbon atoms from the laser-cut channels. Thus, the optical properties of a graphene sheet can be controllably modified by the laser-patterning methods of the present invention. In a similar manner, the thermal and mechanical properties of the graphene can also be tunably modified by forming one or more laser-cut channels in the graphene and by controlling the extent to which the carbon atoms are removed from one or more of the channels.

Thus, in accordance with the present invention, a desired pattern can be formed in a graphene sheet by illuminating the graphene with a beam from an appropriately configured laser. The energy from the laser is transferred to the carbon atoms making up the graphene, causing their bonds to break and the carbon to ablate away to form a narrow, highly defined channel without damaging the surrounding graphene material. The formation of such patterns in graphene can be used to isolate electrical devices formed on the graphene surface and control the flow of current in the graphene in a desired manner.

In addition, a multi-layer graphene structure in which some areas of the structure have fewer layers than others can easily be formed using the laser patterning methods of the present invention. In such embodiments, a desired pattern can be formed on a first graphene sheet using the laser-patterning methods of the present invention. When a second graphene sheet is transferred on the patterned first sheet, the unpatterned portion of the thus-produced multi-layer structure is two sheets thick, while the patterned portion is only one sheet thick. In some embodiments this second graphene sheet can be further patterned, and additional graphene sheets placed on the patterned second sheet to form a multi-layer structure having multiple patterned layers with different thicknesses in different locations on the device. This provides three dimensional patterning of graphene, and enables creation non-planar graphene devices such as tunneling devices, transistors, and photodiodes.

In some embodiments, such patterning of a multilayered graphene sample can be done in situ by focusing the laser on the graphene in the growth chamber, either during or after the growth process. Such patterning of graphene in the growth environment, i.e. before exposure to the ambient atmosphere, not only enables the production of higher quality patterned graphene but also provides the ability to process the graphene as it is grown, thus influencing self-assembly, interconnectivity, and crystallographic orientation (nanoribbons, nanowire, and nanodot geometries).

In the case of CVD-grown graphene, a first graphene layer is grown, a second layer is grown on the first layer, a third layer is grown on the second layer, and so on. Thus, in situ laser-patterning of CVD-grown graphene is done from the "bottom up", where the bottom layer is patterned before the growth of any subsequent layers.

On the other hand, epitaxial graphene is created by sublimating Si from a SiC sample. The first layer is formed on the SiC, with second and subsequent layers effectively growing beneath the first layer. Thus, in situ laser patterning of epitaxial grown graphene is done from the "top down," where the top layer is patterned before the growth of the subsequent layers.

In all cases, the parameters of the laser pulses illuminating the graphene and the patterning conditions can be configured so as to produce laser-cut channels in only one layer of graphene or in multiple layers, to produce patterned graphene having desired electrical, optical, thermal, or mechanical properties.

In addition, in the case of other 2D materials such as $MoS_2$, $WS_2$, $MoSe_2$, and $WSe_2$, the laser parameters can be tuned so that the laser will penetrate a first layer in a multilayered structure without damaging that layer but will pattern a lower layer. Such "reach through" can be accomplished, for example, by tuning the wavelength of the laser to provide selective patterning of one or more layers in a multilayered structure in order to produce a 2D material having desired electrical, optical, thermal, or mechanical properties.

In other embodiments, a multi-layer graphene structure can be formed using the method of the present invention by patterning one to a few layers of graphene on a handle substrate or wafer and then transferring the patterned graphene layers to another rigid or flexible substrate using any suitable transfer method known in the art. By patterning the graphene and then transferring it to a substrate, a patterned graphene sheet on a substrate can be obtained, even if the substrate is one that would be undesirably damaged if the graphene were laser-patterned while on that substrate. Flexible substrates that can be beneficially used in such an embodiment include polyethylene tephthalate (PET), polyethylene naphthalate (PEN), and cellulose. Examples of devices in which such transferred graphene would be useful are detectors or molecular sensors which are subsequently transferred to flexible substrates to enable applications where a flexible substrate is desirable, i.e., conformal attachment to curved surfaces or surfaces that must bend and unbend.

Advantages and New Features

Laser patterning of graphene in accordance with the present invention provides several advantages over the patterning methods of the prior art.

Laser patterning of graphene in accordance with the present invention is chemical-free and produces sub-micron scale patterns directly on any type of graphene, not only epitaxial graphene synthesized on SiC and chemical vapor deposition-grown graphene on metals, but also for graphene exfoliated from graphite, or chemically synthesized graphene.

The sub-micron scale patterns produced in accordance with the present invention can enable the formation of precisely defined desired high-isolation areas on the graphene sheet, which is necessary for electronic applications.

The production of such high-isolation areas in a graphene sheet in accordance with the present invention facilitates the fabrication of various graphene electronic device structures such as transistors, capacitors, photothermoelectric detectors for THz and sub-THz applications, quantum Hall effect structures, and molecular gas sensors. Because the unpatterned portion of the graphene remains pristine, undamaged by the laser and uncontaminated by any chemicals, the performance of such electronic devices is unimpeded by such damage or contamination as would be present in graphene patterned by existing methods.

The production of such precise patterns using the method of the present invention also facilitates the fabrication of nanoribbons, nanodots, and plasmonic structures from the graphene sheet.

Laser patterning in accordance with the present invention also enables the production of graphene sensors by the controlled laser modification of graphene. Graphene is very sensitive to surface interactions. Such sensitivity is one reason it makes a good sensor, but it also makes graphene sensor-containing patterned circuits susceptible to contamination by standard chemical-based lithography fabrication practices. Laser patterning the graphene in accordance with the present invention can be used to isolate sensor elements, thereby also enabling the fabrication of multiple-sensor arrays on the same chip.

Alternatives

Although particular embodiments, aspects, and features have been described and illustrated, it should be noted that the invention described herein is not limited to only those embodiments, aspects, and features, and it should be readily appreciated that modifications may be made by persons skilled in the art.

For example, the methods for laser formation of a pattern in accordance with the present invention are not limited to formation of a pattern in graphene. By using an appropriately configured laser and appropriate pattering conditions, a laser may also be used to form patterns in other two-dimensional materials such as molybdenum disulfide ($MoS_2$), molybdenum diselanide ($MoSe_2$), boron nitride (BN), tungsten disulfide ($WS_2$), or tungsten diselenide ($WSe_2$) which is transferred or synthesized on a substrate such as SiC or some other substrate. Such laser patterning enables the 3D fabrication of unique circuits and devices from vertically stacked 2D heterostructures.

The present application contemplates these and any and all other modifications within the spirit and scope of the underlying invention described and claimed herein, and all such embodiments are within the scope and spirit of the present disclosure.

What is claimed is:

1. A method for forming a laser-patterned two-dimensional material, comprising:
   focusing a pulsed laser beam on a two-dimensional material along a desired path;
   wherein at least one of a wavelength, a beam shape, an optical fluence, a pulse width, and a pulse repetition rate of the pulsed laser beam is configured to cause the pulsed laser beam to ablate atoms from the two-dimensional material to form a channel in the two-dimensional material along the desired path without damaging the remainder of the two-dimensional material not illuminated by the pulsed laser beam; and
   wherein the two-dimensional material is grown by chemical vapor deposition (CVD), a first layer of the two-dimensional material being patterned on a bottom surface thereof before the growth of a second layer of the two-dimensional material on a top surface of the first layer.

2. The method according to claim 1, wherein the two-dimensional material is graphene.

3. A method for forming a laser-patterned two-dimensional material, comprising:
   focusing a pulsed laser beam on a two-dimensional material along a desired path;
   wherein at least one of a wavelength, a beam shape, an optical fluence, a pulse width, and a pulse repetition rate of the pulsed laser beam is configured to cause the pulsed laser beam to ablate atoms from the two-dimensional material to form a channel in the two-dimensional material along the desired path without damaging the remainder of the two-dimensional material not illuminated by the pulsed laser beam; and
   wherein the two-dimensional material is molybdenum disulfide ($MoS_2$), molybdenum diselanide ($MoSe_2$), boron nitride (BN), tungsten disulfide ($WS_2$), or tungsten diselenide ($WSe_2$).

4. The method according to claim 1, wherein the pulsed laser beam is configured to produce a channel having a width less than about 1 μm in the two-dimensional material.

5. The method according to claim 1, wherein the two-dimensional material is patterned in situ while situated in a growth chamber, patterning being completed before the material is exposed to an ambient atmosphere.

6. A method for forming a laser-pattered two-dimensional material, comprising:
   focusing a pulsed laser beam on a two-dimensional material along a desired path;
   wherein at least one of a wavelength, a beam shape, an optical fluence, a pulse width, and a pulse repetition rate of the pulsed laser beam is configured to cause the pulsed laser beam to ablate atoms from the two-dimensional material to form a channel in the two-dimensional material along the desired path without damaging the remainder of the two-dimensional material not illuminated by the pulsed laser beam; and
   wherein the two-dimensional material is epitaxially grown, a first layer of the two-dimensional material being patterned on a top surface thereof before the growth of a second layer of the two-dimensional material on a bottom surface of the top layer.

7. A method for defining a desired current path for an electrical device formed on a two-dimensional material, comprising:
   focusing a pulsed laser beam on the two-dimensional material along a desired path;
   wherein at least one of a wavelength, a beam shape, an optical fluence, a pulse width, and a pulse repetition rate of the pulsed laser beam is configured to cause the pulsed laser beam to ablate atoms from the two-dimensional material to form a plurality of channels around the electrical device without damaging the remainder of the two-dimensional material not illuminated by the pulsed laser beam;
   wherein the two-dimensional material is grown by chemical vapor deposition (CVD), a first layer of the two-dimensional material being pattered on a bottom surface thereof before the growth of a second layer of the two-dimensional material on a top surface of the first layer; and
   wherein the channels are configured to isolate the electrical device and to define a desired current path for the electrical device in the two-dimensional material.

8. The method according to claim 7, wherein the two-dimensional material is graphene.

9. A method for producing a two-dimensional material having desired electrical, optical, thermal, or mechanical properties, comprising:
focusing a first pulsed laser beam on at least one pre-defined location on the two-dimensional material;
wherein at least one of a wavelength, a beam shape, an optical fluence, a pulse width, and a pulse repetition rate of the first pulsed laser beam is to cause the first pulsed laser beam to form one or more ablated channels having a desired extent of ablation in the two-dimensional material without damaging the remainder of the two-dimensional material not illuminated by the first pulsed laser beam, and
illuminating the two-dimensional material with a second pulsed laser beam, the second pulsed laser beam being configured to produce one or more unablated modified areas in the two-dimensional material without damaging the remainder of the two-dimensional material not illuminated by either the first or the second pulsed laser beam; and
wherein the extent of the ablation is tuned such that a combination of the ablated channels and the unablated modified areas produce the desired electrical, optical, thermal, or mechanical property of the two-dimensional material.

10. The method according to claim 9, wherein the two-dimensional material is graphene.

11. The method according to claim 9, wherein at least two channels having different extents of ablation are formed, the extent of ablation of the two-dimensional material in each channel being tuned to produce the desired electrical, optical, thermal, or mechanical property of the two-dimensional material.

12. A method for producing a two-dimensional material having desired electrical, optical, thermal, or mechanical properties, comprising,
focusing a pulsed laser beam on at least one predefined location on the two-dimensional material;
wherein at least one of a wavelength, a beam shape, an optical fluence, a pulse width, and a pulse repetition rate of the pulsed laser beam is configured to cause the pulse laser beam to form one or more ablated channels having a desired extent of ablation in the two-dimensional material without damaging the remainder of the two-dimensional material not illuminated by the pulsed laser beam, the extent of ablation being tuned to produce a desired electrical, optical, thermal, or mechanical property of the two-dimensional material;
wherein the two-dimensional material is a multilayered two-dimensional material; and
wherein the pulsed laser beam is configured to pass through a first layer of the multilayered two-dimensional material to pattern a second layer of the multi-layered two-dimensional material situated below the first layer.

13. A method for producing a multilayered two-dimensional material having a varying layer thickness, comprising:
focusing a pulsed laser beam on a sheet of a first two-dimensional material along a desired path in the two-dimensional material, at least one of a wavelength, a beam shape, an optical fluence, a pulse width, and a pulse repetition rate being configured to cause the pulsed laser beam to ablate atoms from the first two-dimensional material and to form a channel in the first two-dimensional material in the portion of the first two-dimensional material illuminated by the laser beam without damaging a portion of the first two-dimensional material not illuminated by the pulsed laser beam to form a patterned first two-dimensional material; and
transferring a sheet of a second two-dimensional material onto the patterned first two-dimensional material to form a multi-layered two-dimensional material, wherein a portion of the multi-layered two-dimensional material comprising an unpatterned portion of the first two-dimensional material and the second two-dimensional material is two sheets thick and a portion of the multi-layered two-dimensional material comprising a patterned portion of the first two-dimensional material and the second two-dimensional material is one sheet thick.

14. A method for forming a laser-patterned two-dimensional material on a laser-sensitive substrate, comprising:
focusing a pulsed laser beam on a two-dimensional material situated on a handle substrate and directing the pulsed laser beam along a desired path in the two-dimensional material, at least one of a wavelength, a beam shape, an optical fluence, a pulse width, and a pulse repetition rate being configured to cause the pulsed laser beam to ablate atoms from the two-dimensional material to produce a laser-patterned two-dimensional material having an ablated channel formed along the desired path, the ablated channel being formed without damaging the remainder of the two-dimensional material not illuminated by the pulsed laser beam;
removing the laser-patterned two-dimensional material from the handle wafer; and
transferring the laser-patterned two-dimensional material to the laser-sensitive substrate.

15. The method according to claim 14, wherein the laser-sensitive substrate is a flexible substrate formed from one of polyethylene tephthalate (PET), polyethylene naphthalate (PEN), and cellulose.

16. The method according to claim 6, wherein the two-dimensional material is graphene.

17. The method according to claim 6, wherein the pulsed laser beam is configured to produce a channel having a width less than about 1 µm in the two-dimensional material.

18. The method according to claim 6, wherein the two-dimensional material is patterned in situ while situated in a growth chamber, patterning being completed before the material is exposed to an ambient atmosphere.

19. The method according to claim 12, wherein the two-dimensional material is graphene.

20. The method according to claim 12, wherein at least two channels having different extents of ablation are formed, the extent of ablation of the two-dimensional material in each channel being tuned to produce the desired electrical, optical, thermal, or mechanical property of the two-dimensional material.

21. A method for defining a desired current path for an electrical device formed on a two-dimensional material, comprising:
focusing a pulsed laser beam on a two-dimensional material along a desired path;
wherein at least one of a wavelength, a beam shape, an optical fluence, a pulse width, and a pulse repetition rate of the pulsed lasers beam is configured to cause the pulsed laser beam to ablate atoms from the two-dimensional material to form a plurality of channels around the electrical device without damaging the remainder of the two-dimensional material not illuminated by the pulsed laser beam;

wherein the two-dimensional material is epitaxially grown, a first layer of the two-dimensional material being patterned on a top surface thereof before the growth of a second layer of the two-dimensional material on a bottom surface of the top layer; and wherein the channels are configured to isolate the electrical device and to define a desired current path for the electrical device in the two-dimensional material.

22. The method according to claim 21, wherein the two-dimensional material is graphene.

* * * * *